(12) United States Patent
Jung

(10) Patent No.: US 11,925,007 B2
(45) Date of Patent: Mar. 5, 2024

(54) HEAT DISSIPATION ASSEMBLY STRUCTURE FOR POWER PART

(71) Applicant: HYUNDAI MOBIS Co., Ltd., Seoul (KR)

(72) Inventor: Ji Min Jung, Yongin-si (KR)

(73) Assignee: HYUNDAI MOBIS Co., Ltd., Seoul (KR)

( * ) Notice: Subject to any disclaimer, the term of this patent is extended or adjusted under 35 U.S.C. 154(b) by 116 days.

(21) Appl. No.: 17/556,109

(22) Filed: Dec. 20, 2021

(65) Prior Publication Data

US 2022/0209513 A1 Jun. 30, 2022

(30) Foreign Application Priority Data

Dec. 24, 2020 (KR) .................. 10-2020-0183870

(51) Int. Cl.
*H05K 7/20* (2006.01)
(52) U.S. Cl.
CPC ......... *H05K 7/209* (2013.01); *H05K 7/20854* (2013.01)
(58) Field of Classification Search
CPC ... H05K 7/2049; H05K 7/20854; H05K 7/209
See application file for complete search history.

(56) References Cited

U.S. PATENT DOCUMENTS

| 5,172,756 | A | * | 12/1992 | Jayamanne | ......... | H01L 23/4006 |
| | | | | | | 361/720 |
| 5,321,582 | A | * | 6/1994 | Casperson | .......... | H05K 7/2049 |
| | | | | | | 361/705 |
| 5,396,404 | A | * | 3/1995 | Murphy | .............. | H01L 23/4006 |
| | | | | | | 257/E23.084 |
| 5,402,313 | A | * | 3/1995 | Casperson | .......... | H05K 7/2049 |
| | | | | | | 174/16.3 |
| 5,504,653 | A | * | 4/1996 | Murphy | ............. | H01L 23/4093 |
| | | | | | | 361/704 |
| 6,081,424 | A | * | 6/2000 | Mach | .................... | H05K 7/2049 |
| | | | | | | 361/728 |
| 6,225,559 | B1 | * | 5/2001 | Hubner | ................ | H05K 7/2049 |
| | | | | | | 174/547 |
| 6,864,573 | B2 | * | 3/2005 | Robertson | .......... | H05K 7/20409 |
| | | | | | | 361/801 |
| 7,778,036 | B2 | * | 8/2010 | Kontani | ............... | H05K 7/2049 |
| | | | | | | 257/718 |
| 9,949,405 | B2 | * | 4/2018 | Binder | ................. | H05K 7/2049 |
| 10,321,565 | B2 | * | 6/2019 | Kuo | ....................... | H05K 3/303 |

(Continued)

FOREIGN PATENT DOCUMENTS

DE 19712099 A1 * 5/1998 ............. H05K 7/142
EP 0652694 A1 * 5/1995 ......... H05K 7/20854

(Continued)

*Primary Examiner* — Robert J Hoffberg
(74) *Attorney, Agent, or Firm* — NSIP Law

(57) ABSTRACT

The heat dissipation assembly structure of a power includes a housing having an open upper portion, a power part having one surface supported by the housing, a printed circuit board disposed above the power part and electrically connected to the power part, and a cover member covering the upper portion of the housing and being coupled to the housing, wherein an inner surface of the cover member presses the other surface of the power part in a direction toward the housing to fixedly press the power part between the housing and the cover member.

12 Claims, 10 Drawing Sheets

(56) References Cited

U.S. PATENT DOCUMENTS

| | | | | |
|---|---|---|---|---|
| 10,568,206 B2 * | 2/2020 | Kuo | ............... | H05K 3/303 |
| 10,568,207 B2 * | 2/2020 | Kuo | ............... | H05K 1/181 |
| 10,624,244 B2 * | 4/2020 | Theander | ............ | H01L 25/18 |
| 11,553,628 B2 * | 1/2023 | Yamashima | ........... | H05K 7/209 |
| 2014/0049102 A1 * | 2/2014 | Li | ..................... | H05K 5/03 |
| | | | | 307/9.1 |
| 2020/0343155 A1 * | 10/2020 | Kiyonaga | ............ | H05K 1/0206 |
| 2022/0061186 A1 * | 2/2022 | Kimura | ............ | H01L 23/367 |

FOREIGN PATENT DOCUMENTS

| | | | | |
|---|---|---|---|---|
| KR | 20230020313 A * | 2/2023 | ............... | H05K 7/12 |
| WO | WO-2018198953 A1 * | 11/2018 | ............. | H02M 1/00 |

\* cited by examiner

BOLTING

-- Related Art --

HEAT DISSIPATION ASSEMBLY STRUCTURE FOR POWER PART

CROSS-REFERENCE TO RELATED APPLICATION

This application claims the benefit under 35 USC § 119(a) of Korean Patent Application No. 10-2020-0183870, filed on Dec. 24, 2020 in the Korean Intellectual Property Office, the entire disclosure of which is incorporated herein by reference for all purposes.

BACKGROUND

1. Field

The following description relates to a heat dissipation assembly structure of a power part, and more particularly, to a heat dissipation assembly structure of a power part, in which a power part is easily fixed without a component such as a bolt or the like and which effectively dissipates heat generated by the power part.

2. Discussion of Related Art

In electronic vehicles and hybrid vehicles which are eco-friendly vehicles, since electricity is a power source, various electrical and electronic components such as motors, inverters, converters, batteries, on board chargers (OBCs), are included therein, and control of electricity is most important.

Since many printed circuit boards (PCBs) are used for electrical control, and most components are switching elements which consume power and generate a large amount of heat, a structure for heat dissipation is important.

In the case of a power part such as a field effect transistor (FET) or diode among heating components, since heat dissipation performance and a package size are affected according to an assembly method, a structure for heat dissipation is one important factor when a design concept is determined.

FIGS. 1A and 1B is a view illustrating a conventional heat dissipation assembly structure in which a power part is disposed parallel to the PCB, FIGS. 2A and 2B is a view illustrating a conventional heat dissipation assembly structure in which a power part is disposed perpendicular to a PCB, and FIG. 3 is a side cross-sectional structure view illustrating the conventional heat dissipation assembly structure of FIGS. 2A and 2B.

When the power part is disposed parallel to the PCB, that is, in a direction which is the same as a direction of the PCB as illustrated in FIGS. 1A and 1B, although a structure, which effectively dissipates heat, may be implemented, a size of a product should be enlarged, and a metal PCB, a bolt (one piece per component), a thermal interface material (TIM), and the like are additionally needed and become a factor in cost increase when compared to the structure in which the power part is disposed perpendicular to the PCB as illustrated in FIGS. 2 and 3.

In addition, when the power part is disposed perpendicular to the PCB as illustrated in FIGS. 2A, 2B and 3, the structure may be vulnerable to heat dissipation when compared to the structure in which the power part is disposed parallel to the PCB as illustrated in FIGS. 1A and 1B, and particularly, when assembly is performed using a clamp, plastic deformation of the clamp occurs, a force, which presses the power part against the PCB, becomes insufficient, and thus there may be a problem in heat dissipation of the power part.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a heat dissipation assembly structure of a power part, including a housing having an open upper portion, a power part having one surface supported by the housing, a printed circuit board disposed above the power part and electrically connected to the power part, and a cover member covering the upper portion of the housing and being coupled to the housing, wherein an inner surface of the cover member presses the other surface of the power part in a direction toward the housing to fixedly press the power part between the housing and the cover member.

Each of the housing and the cover member may be formed of a metal material, and the housing and the cover member that are in contact with two surfaces of the power part may be configured to dissipate heat generated by the power part in two directions.

The heat dissipation assembly structure may include a support protrusion protruding from the housing, and a pressing protrusion protruding from the inner surface of the cover member and pressing the other surface of the power part in a direction toward the support protrusion, wherein the one surface of the power part may be in contact with and supported by the support protrusion.

A first inclined surface may be formed on an upper portion of the support protrusion, the one surface of the power part may be in contact with and being obliquely supported by the first inclined surface, a second inclined surface may be in contact with the other surface of the power part is formed on the pressing protrusion, and the power part may be fixedly pressed by the second inclined surface in a direction of the first inclined surface.

A heat dissipation pad may be disposed between the pressing protrusion and the other surface of the power part.

The heat dissipation pad may have an elastic force, and the heat dissipation pad is compressed by the pressing protrusion.

An insulating sheet may be disposed between the first inclined surface and the one surface of the power part.

In another general aspect, there is provided a heat dissipation assembly structure of a power part, including a housing having an open upper portion, a power part having one surface supported by the housing, a printed circuit board disposed above the power part and electrically connected to the power part, a cover member covering the upper portion of the housing and being coupled to the housing, and a heat dissipation pad disposed between an inner surface of the cover member and the other surface of the power part, wherein the inner surface of the cover member presses the heat dissipation pad in a direction toward the housing to fixedly press the power part between the housing and the heat dissipation pad.

The other surface of the power part may be assembled in a state in which the other surface of the power part is attached to one surface of the heat dissipation pad.

Each of the housing and the cover member may be formed of a metal material, and the housing and the cover member that are disposed on two surfaces of the power part may be configured to dissipate heat generated by the power part in two directions.

The heat dissipation assembly structure may include a support protrusion protruding from the housing, a first inclined surface may be formed on an upper portion of the support protrusion, the one surface of the power part may be in contact with and being obliquely supported by the first inclined surface, the one surface of the heat dissipation pad may be in contact with the other surface of the power part, the other surface of the heat dissipation pad may be in contact with the inner surface of the cover member, and a third inclined surface may be formed on the one surface of the heat dissipation pad attached to the other surface of the power part to obliquely dispose the power part attached to the third inclined surface.

When the cover member is assembled, the inner surface of the cover member may be in contact with the other surface of the heat dissipation pad and may fixedly presses the power part obliquely coupled to one surface of the heat dissipation pad in a direction toward the first inclined surface.

The heat dissipation pad may have an elastic force and is compressed by an external force.

An insulating sheet may be disposed between the first inclined surface and the one surface of the power part.

Other features and aspects will be apparent from the following detailed description, the drawings, and the claims.

Figure 1A:
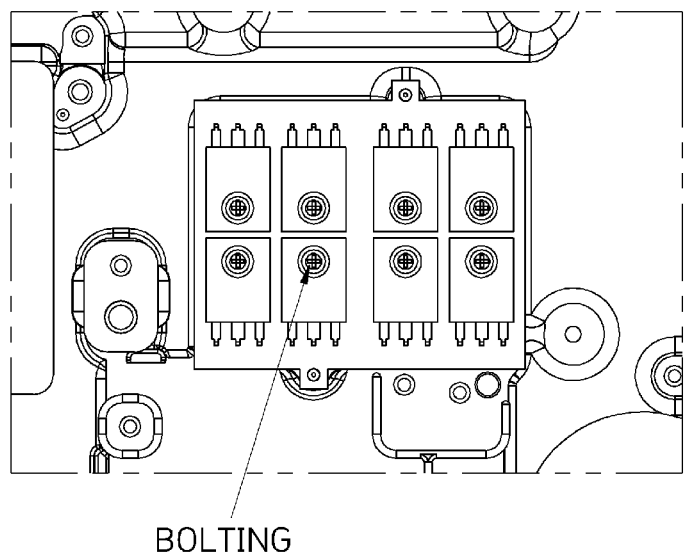
FIGS. 1A and 1B is a view illustrating a conventional heat dissipation assembly structure in which a power part is disposed parallel to a printed circuit board (PCB).
Figure 1B:
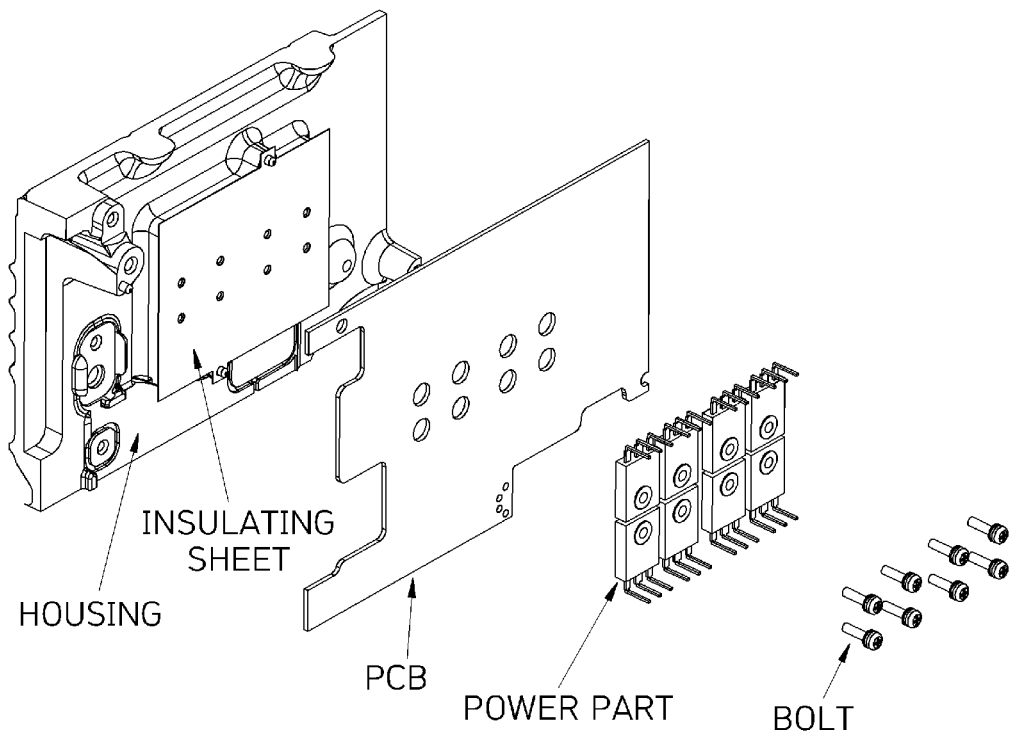
Figure 2A:
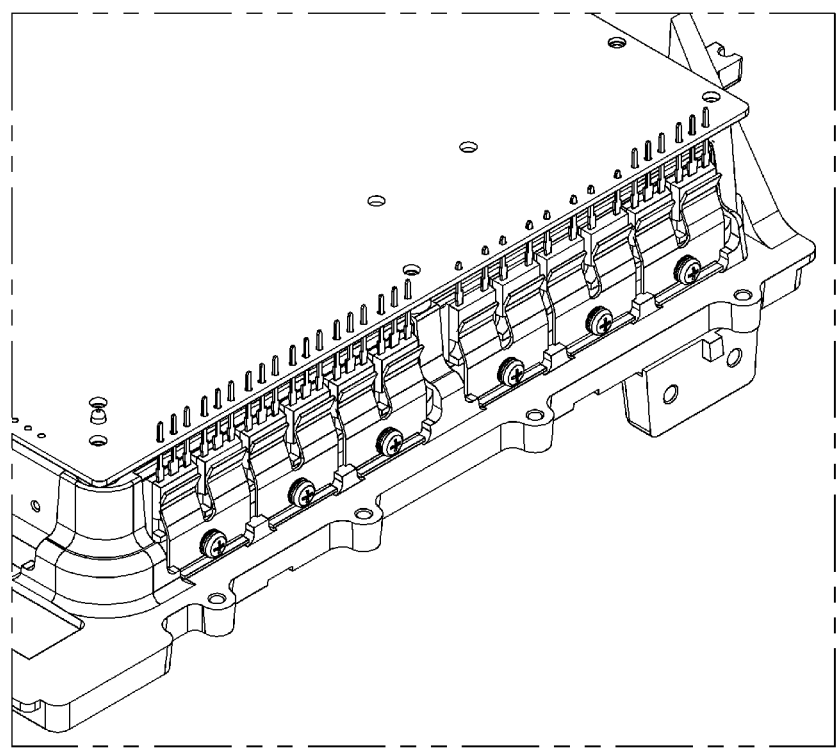
FIGS. 2A and 2B is a view illustrating a conventional heat dissipation assembly structure in which a power part is disposed perpendicular to a PCB.
Figure 2B:
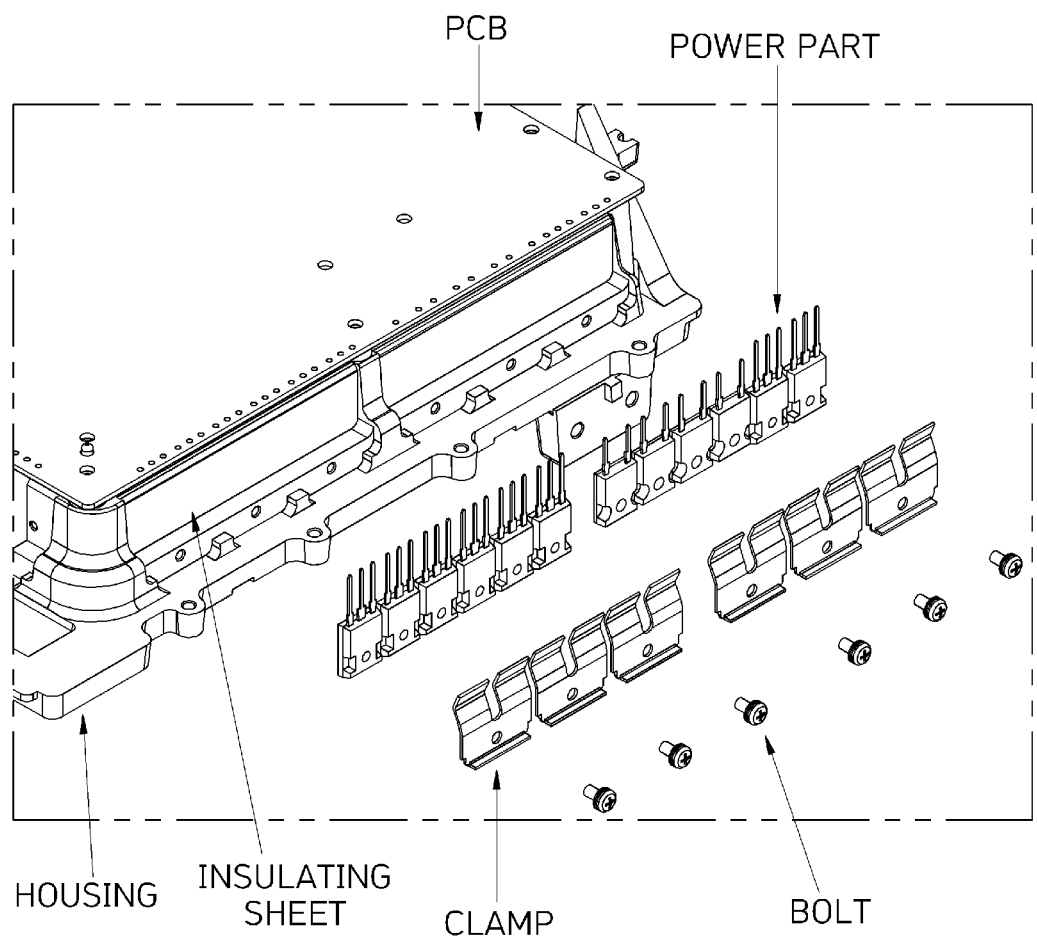
Figure 3:
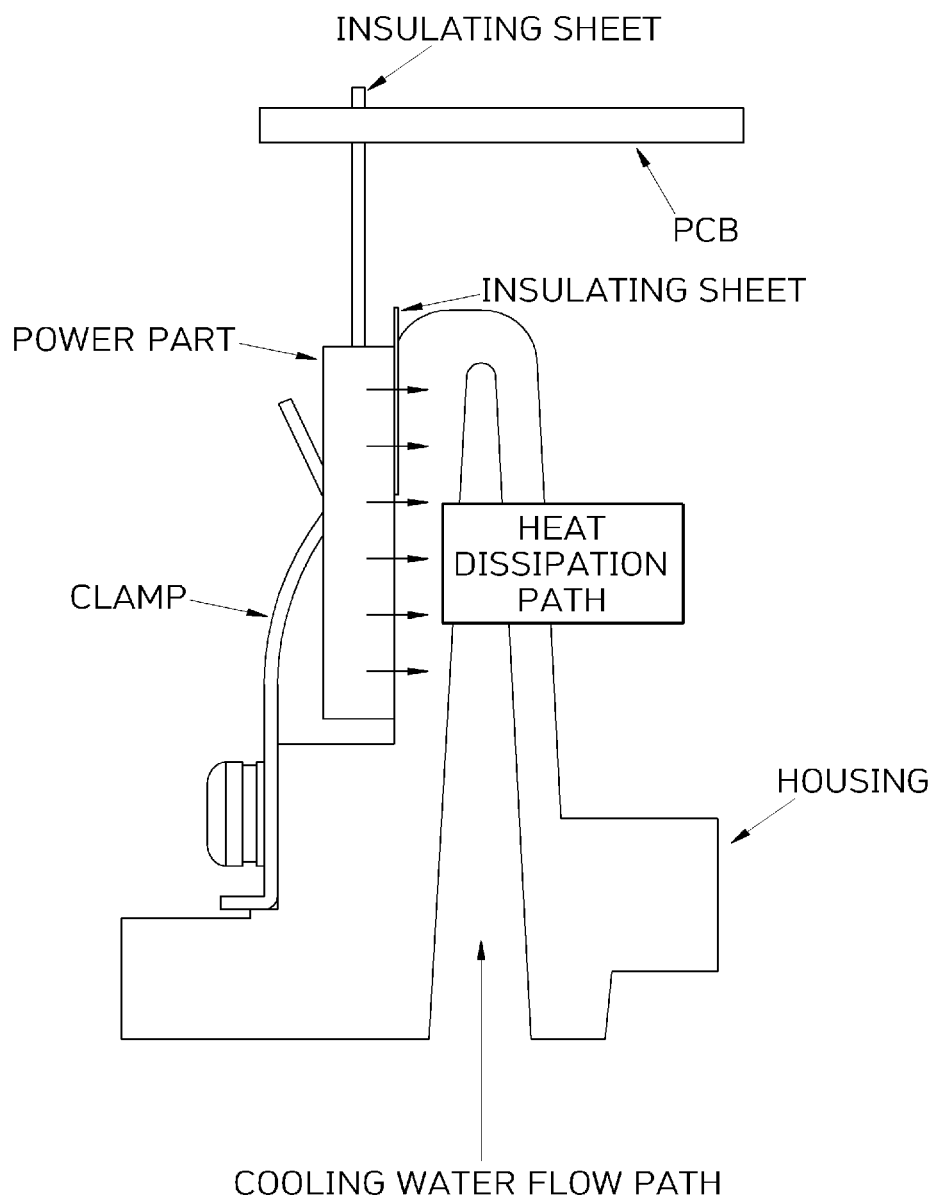
FIG. 3 is a side cross-sectional structure view illustrating the conventional heat dissipation assembly structure of FIGS. 2A and 2B.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only and is not to be limiting of the examples. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Also, in the description of the components, terms such as first, second, A, B, (a), (b) or the like may be used herein when describing components of the present disclosure. These terms are used only for the purpose of discriminating one constituent element from another constituent element, and the nature, the sequences, or the orders of the constituent elements are not limited by the terms. When one constituent element is described as being "connected", "coupled", or "attached" to another constituent element, it should be understood that one constituent element can be connected or attached directly to another constituent element, and an intervening constituent element can also be "connected", "coupled", or "attached" to the constituent elements.

When describing the examples with reference to the accompanying drawings, like reference numerals refer to like constituent elements and a repeated description related thereto will be omitted. In the description of examples, detailed description of well-known related structures or functions will be omitted when it is deemed that such description will cause ambiguous interpretation of the present disclosure.

Figure 4:
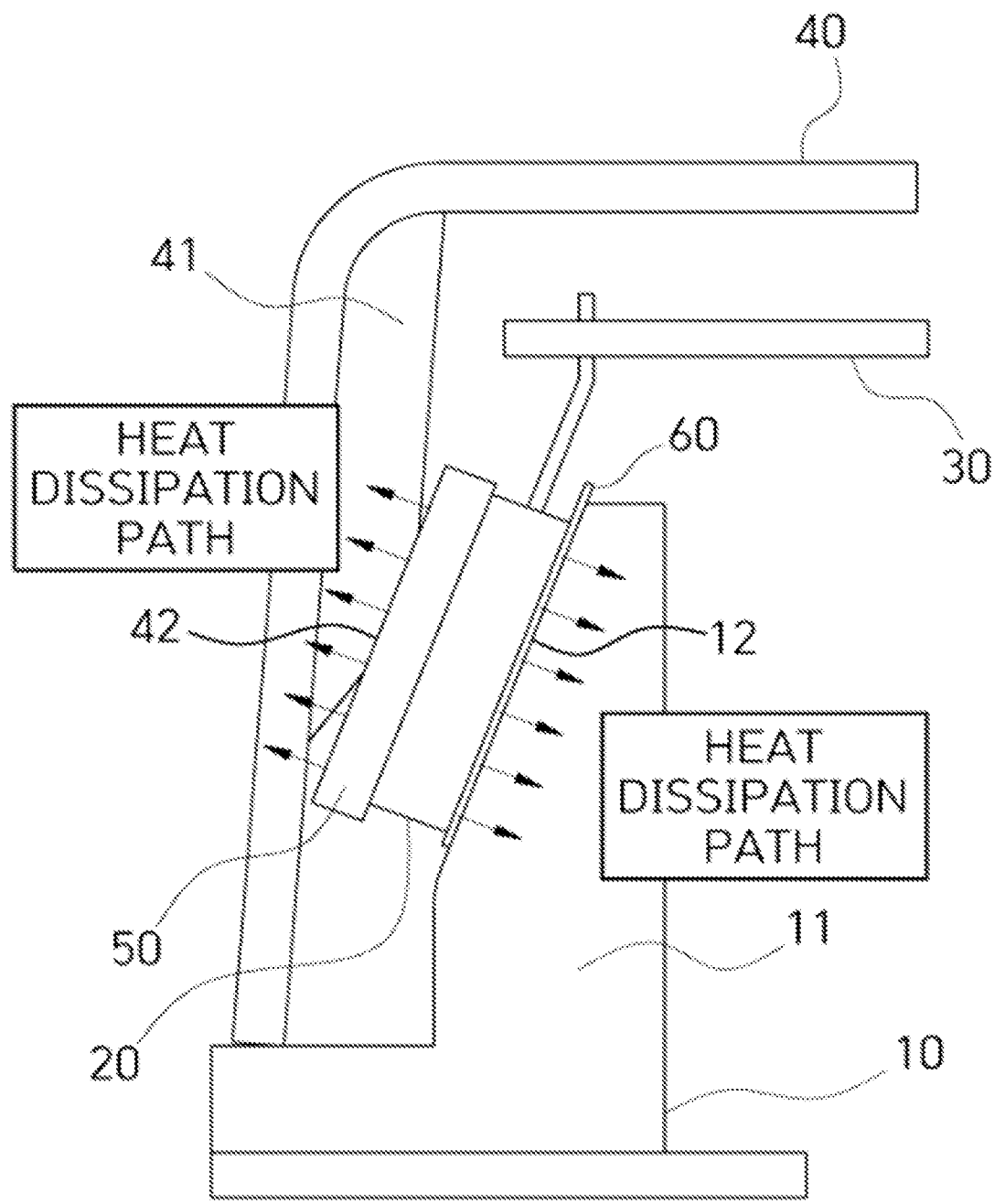
FIG. 4 is a cross-sectional structure view illustrating a heat dissipation assembly structure of a power part according to a first embodiment of the present invention.
Figure 5:
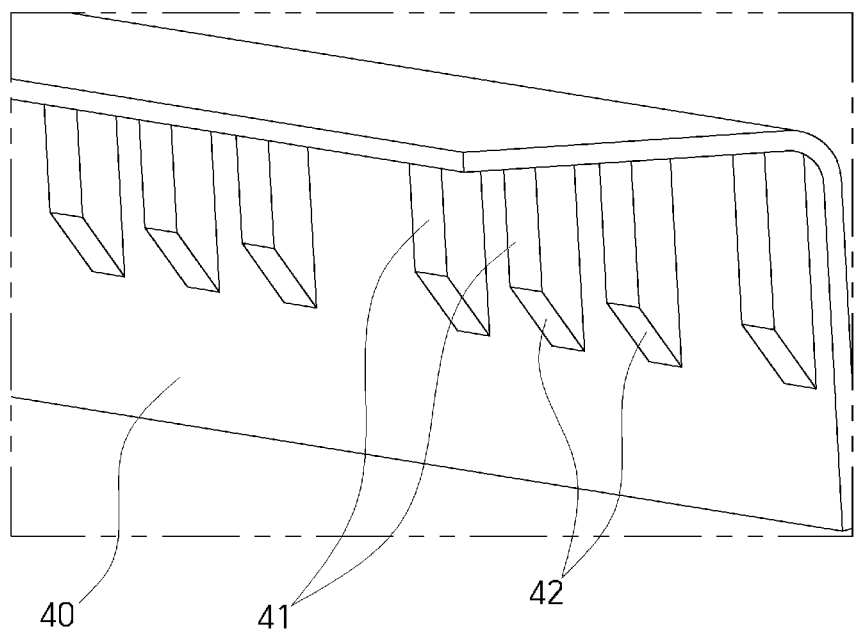
FIG. 5 is a perspective view illustrating an inner surface of a cover member according to the first embodiment of the present invention.
Figure 6:
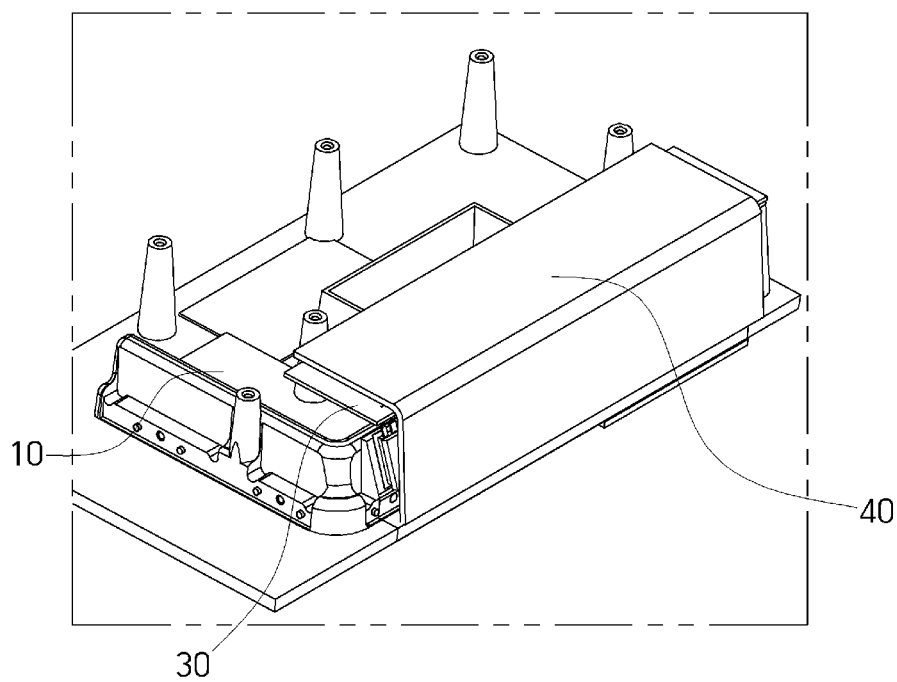
FIG. 6 is a perspective view illustrating a product to which the heat dissipation assembly structure of the power part according to the first embodiment of the present invention is applied.
Figure 7:
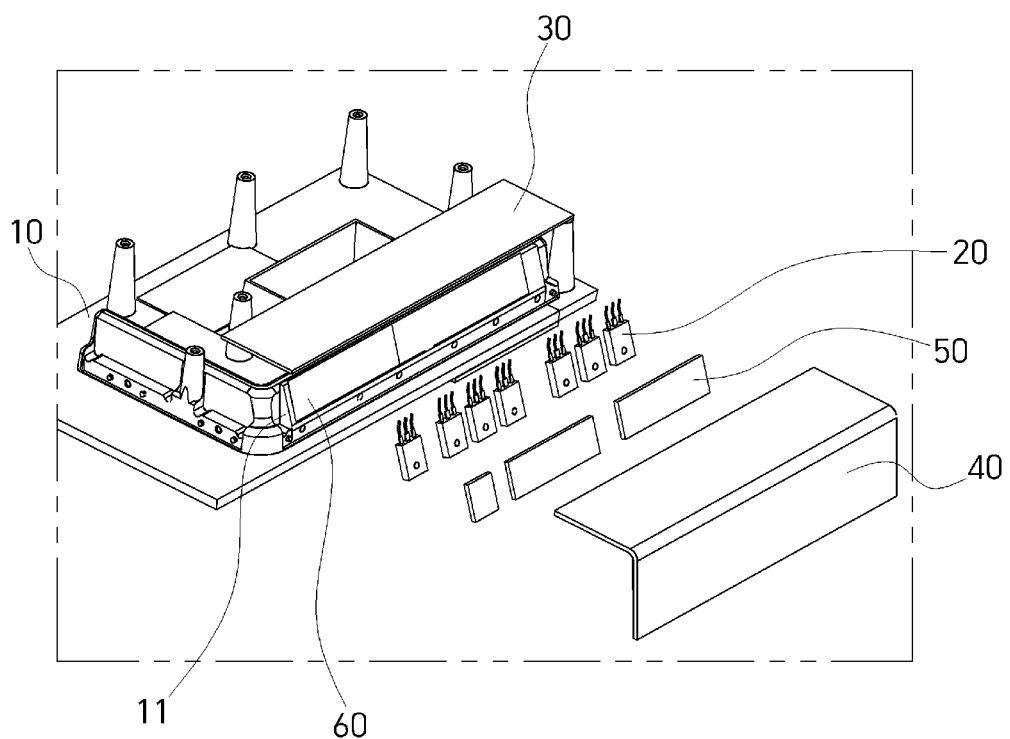
FIG. 7 is an exploded perspective view illustrating the product to which the heat dissipation assembly structure of the power part according to the first embodiment of the present invention is applied.

FIG. 4 is a cross-sectional structure view illustrating a heat dissipation assembly structure of a power part according to a first embodiment of the present invention, FIG. 5 is a perspective view illustrating an inner surface of a cover member according to the first embodiment of the present invention, FIG. 6 is a perspective view illustrating a product to which the heat dissipation assembly structure of the power part according to the first embodiment of the present invention is applied, and FIG. 7 is an exploded perspective view illustrating the product to which the heat dissipation assembly structure of the power part according to the first embodiment of the present invention is applied.

As illustrated in FIGS. 4 to 7, the heat dissipation assembly structure of the power part includes a housing 10, a power part 20, a printed circuit board (PCB) 30, a cover member 40, and a heat dissipation pad 50.

The housing 10 is formed so that an upper portion thereof is open.

A support protrusion 11 is formed to protrude from an upper surface of the housing 10.

A first inclined surface 12 is formed on an upper portion of the support protrusion 11.

The power part 20 is a component which generates heat and is formed in a substantially hexahedron shape, and one surface of the power part 20 is in contact with and is supported by the housing 10.

More specifically, one surface of the power part 20 is in contact with and is supported by the first inclined surface 12, which is obliquely formed, of the support protrusion 11, and thus the power part 20 is obliquely disposed.

In this case, an insulating sheet 60 is disposed between the first inclined surface 12 and one surface of the power part 20.

The PCB 30 is disposed above the power part 20 in a direction parallel to the power part 20 and electrically connected to the power part 20.

In the present invention, since the power part 20 is disposed in a direction perpendicular to or inclined with respect to the PCB 30, an overall size of the product may be reduced.

The cover member 40 covers an upper portion of the housing 10 and is coupled to the housing 10.

An inner surface of the cover member 40 presses the other surface of the power part 20 in a direction toward the housing 10 so that the power part 20 is fixedly pressed between the housing 10 and the cover member 40

To this end, a pressing protrusion 41 is formed to protrude from the inner surface of the cover member 40 as illustrated in FIGS. 4 and 5.

When the cover member 40 is assembled with the housing 10, the pressing protrusion 41 presses the other surface of the power part 20 in a direction toward the support protrusion 11.

Accordingly, the power part 20 is fixedly pressed between the pressing protrusion 41 and the support protrusion 11 in an inclined state.

In order to stably fix the power part 20 in the inclined state, a second inclined surface 42 in contact with the other surface of the power part 20 may be formed on the pressing protrusion 41.

Accordingly, in the state in which the power part 20 is obliquely disposed, one surface of the power part 20 is in contact with the first inclined surface 12 of the support protrusion 11, and the other surface thereof is in contact with and is supported by the second inclined surface 42 of the pressing protrusion 41.

In addition, the power part 20 is fixedly pressed in a direction in which the first inclined surface 12 is formed by the second inclined surface 42 formed on the support protrusion 11.

The heat dissipation pad 50 is disposed between the pressing protrusion 41 formed on the inner surface of the cover member 40 and the other surface of the power part 20.

Since the heat dissipation pad 50 has an elastic force, the heat dissipation pad 50 is compressed by the pressing member when the cover member 40 is assembled.

Accordingly, when the cover member 40 is assembled with the housing 10, as illustrated in FIG. 4, the pressing protrusion 41 formed on the inner surface of the cover member 40 presses the heat dissipation pad 50 in the direction toward the support protrusion 11 of the housing 10 so that the power part 20 is fixedly pressed between the housing 10 and the heat dissipation pad 50.

In this case, since the first inclined surface 12 and the second inclined surface 42 are formed on the pressing protrusion 41 and the support protrusion 11, respectively, the power part 20 is stably and fixedly pressed thereagainst without sliding in the state in which the power part 20 is obliquely disposed.

In addition, each of the housing 10 and the cover member 40 may be formed of a metal material for heat dissipation.

Accordingly, heat generated by the power part 20 may be dissipated in two directions through the housing 10 and the cover member 40 which are in contact with two surfaces of the power part 20, and thus the heat dissipation performance of the power part 20 can be improved.

In the present invention, when the cover member 40 is assembled with the housing 10 as described above, since the power part 20 is fixedly pressed due to an internal structure, a separate component for fixing the power part 20 is not required.

In addition, since the power part 20 is fixed by a pressing amount in consideration of a permanent compression reduction rate using the elastic force of the heat dissipation pad 50, the elastic force may be easily maintained.

In addition, since each of the housing 10 and the cover member 40 is formed of the metal material through which heat is dissipated, heat generated from two surfaces of the power part 20 may be dissipated in two directions so that the heat dissipation performance can be improved.

Figure 8:
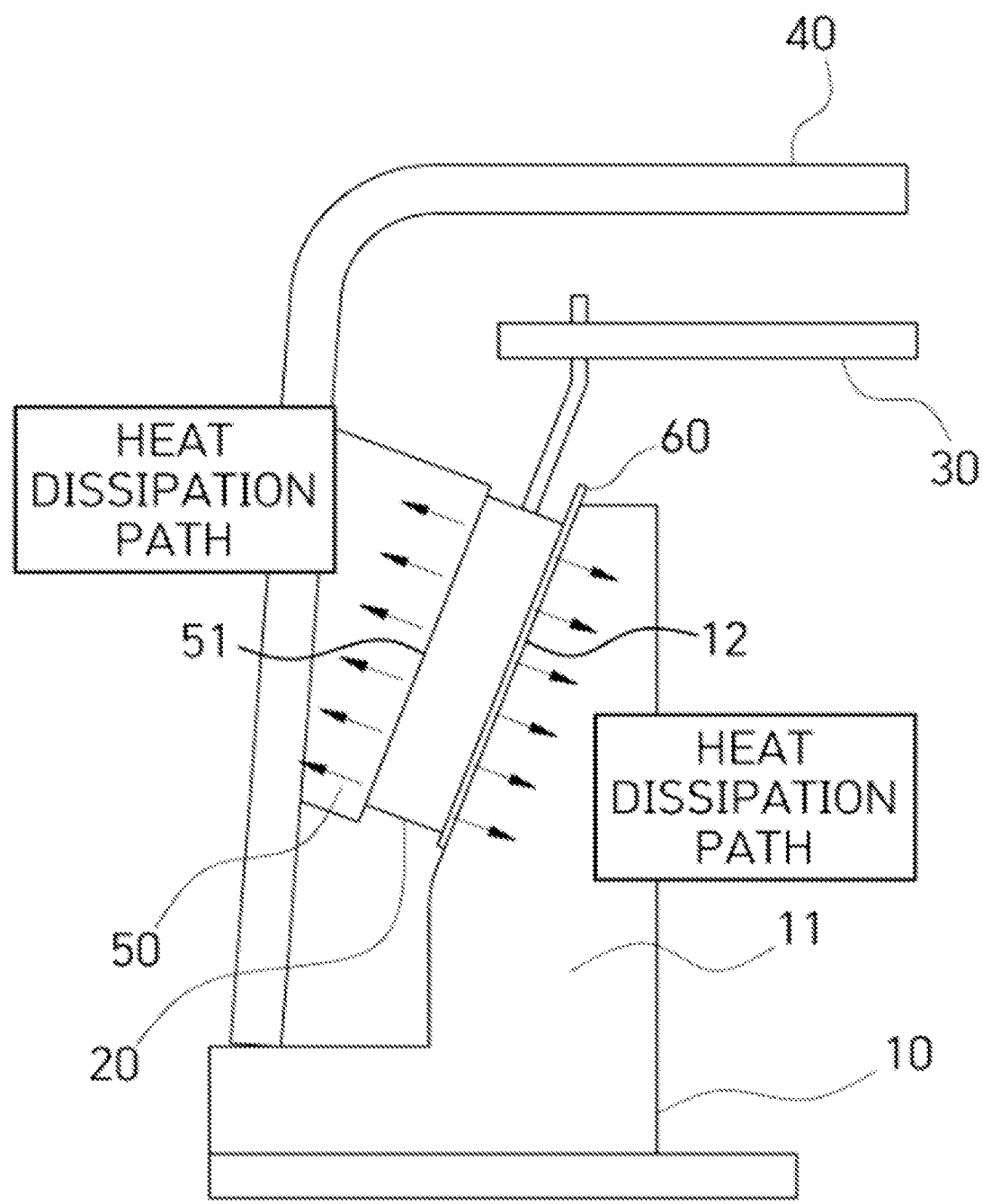
FIG. 8 is a cross-sectional structure view illustrating a heat dissipation assembly structure of a power part according to a second embodiment of the present invention.
Figure 9:
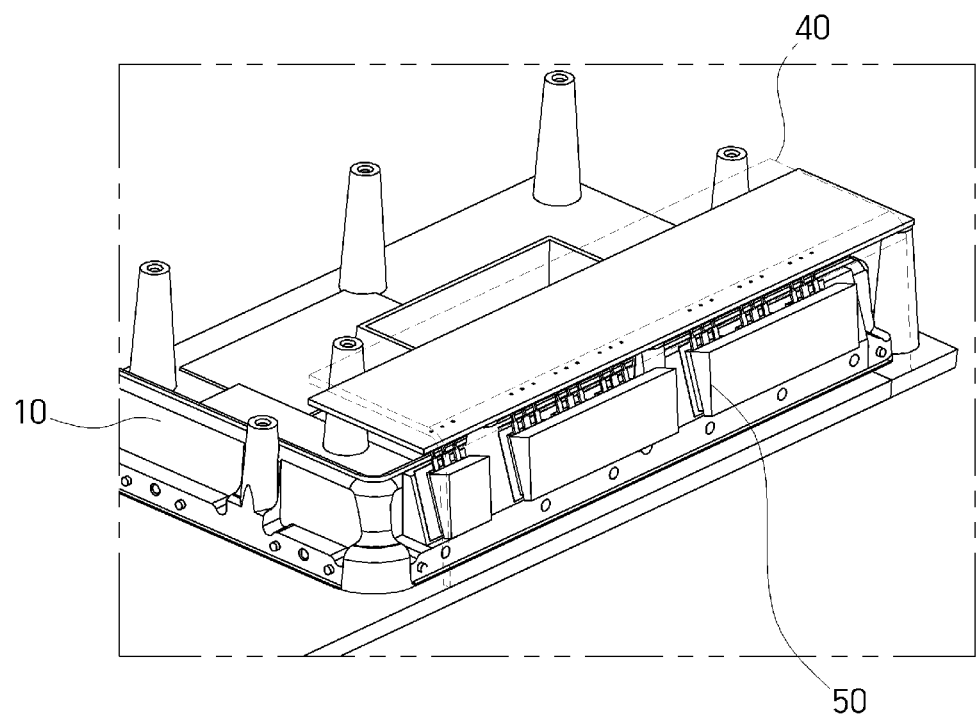
FIG. 9 is a perspective view illustrating a product to which the heat dissipation assembly structure of the power part according to the second embodiment of the present invention is applied.
Figure 10:
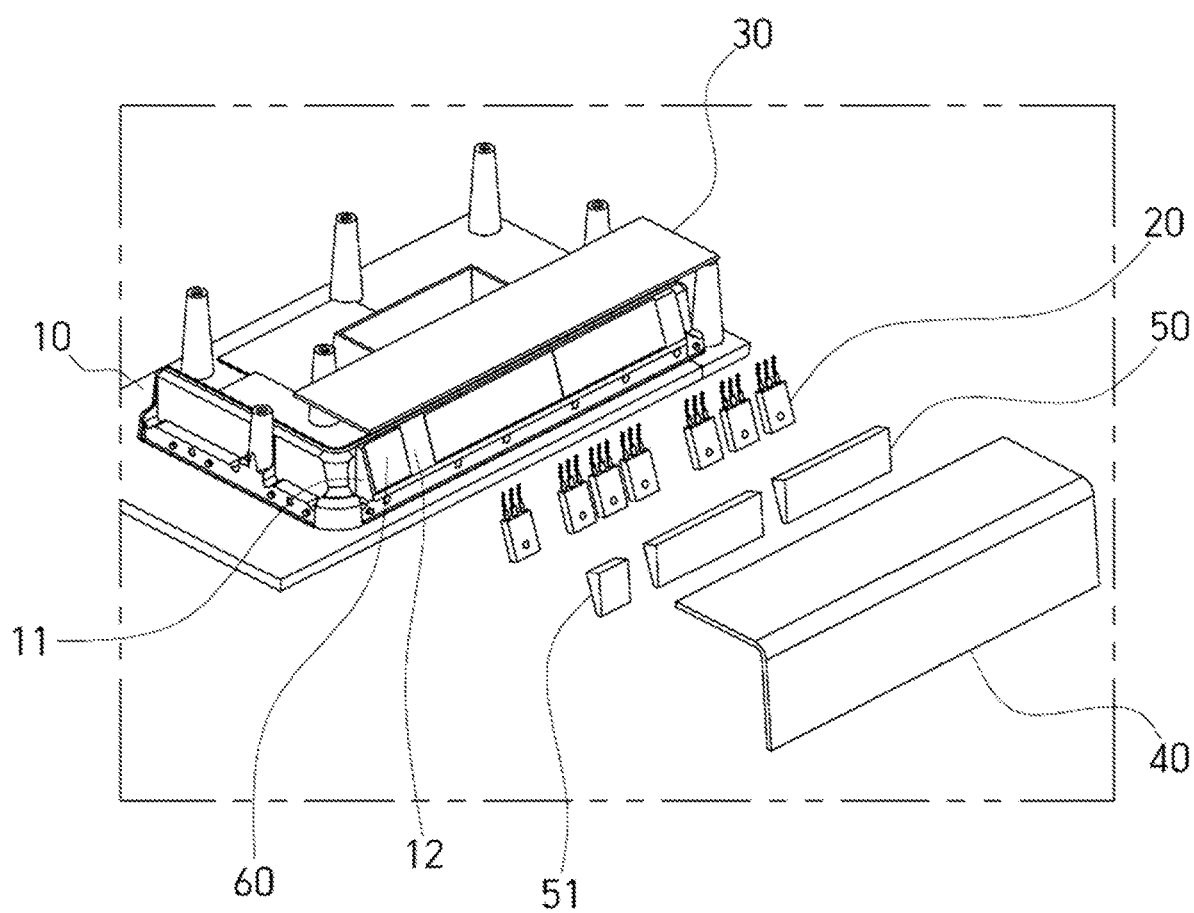
FIG. 10 is an exploded perspective view illustrating the product to which the heat dissipation assembly structure of the power part according to the second embodiment of the present invention is applied.

FIG. 8 is a cross-sectional structure view illustrating a heat dissipation assembly structure of a power part according to a second embodiment of the present invention, FIG. 9 is a perspective view illustrating a product to which the heat dissipation assembly structure of the power part according to the second embodiment of the present invention is applied, and FIG. 10 is an exploded perspective view illustrating the product to which the heat dissipation assembly structure of the power part according to the second embodiment of the present invention is applied.

As illustrated in FIGS. 8 to 10, the heat dissipation assembly structure of the power part of the present invention includes a housing 10, a power part 20, a PCB 30, a cover member 40, and a heat dissipation pad 50.

Since the cover member 40 and the heat dissipation pad 50 according to the second embodiment are different from those according to the first embodiment, the cover member 40 and the heat dissipation pad 50 will be mainly described.

The power part 20 is in contact with and is supported by a first inclined surface 12 formed on a support protrusion 11 in an inclined state.

One surface of the heat dissipation pad 50 is in contact with the other surface of the power part 20, and the other surface thereof is in contact with an inner surface of the cover member 40.

In this case, since one surface of the heat dissipation pad 50 is formed as an adhesive surface, the other surface of the power part 20 is attached to the one surface of the heat dissipation pad 50.

Before the cover member 40 is assembled, the power part 20 is attached to one surface of the heat dissipation pad 50.

A third inclined surface 51 is formed on one surface of the heat dissipation pad 50 attached to the other surface of the power part 20.

Accordingly, the power part 20 attached to the third inclined surface 51 is obliquely disposed.

Due to such a structure, when the cover member 40 is assembled, the inner surface of the cover member 40 is in contact with the other surface of the heat dissipation pad 50 and presses the power part 20 obliquely coupled to one surface of the heat dissipation pad 50 in a direction toward the first inclined surface 12.

Accordingly, the power part 20 is fixedly pressed between the housing 10 and the heat dissipation pad 50 in the inclined state.

Since the other contents are the same as those of the first embodiment, the other contents will be omitted.

According to a heat dissipation assembly structure of a power part according to the present invention described above, there are following effects.

In the present invention, when a cover member is assembled with a housing, since a power part is fixedly pressed due to an internal structure, a separate component such as a bolt for fixing the power part is not required, and thus an assembly process can be simplified.

Since the power part is disposed perpendicular to or obliquely with respect to a PCB, an overall size of a product in which the power part is mounted on the PCB can be reduced.

In addition, since the power part is fixed by a pressing amount in consideration of a permanent compression reduction rate using an elastic force of a heat dissipation pad, the elastic force is easily maintained.

In addition, since each of the housing and the cover member is formed of a metal material through which heat is dissipated, heat generated from two surfaces of the power part can be dissipated in two directions so that the heat dissipation performance and a durability lifespan can be improved, and since a separate cooling structure is not required due to the high heat dissipation performance, the overall size of the product can be reduced.

The heat dissipation assembly structure of the power part according to the present invention is not limited to the above-described embodiment and may be variously modified and implemented within a range in which the technical spirit of the present invention allows.

As described above, there is provided a heat dissipation assembly structure of a power part, in which an overall size of a power part mounted on a printed circuit board (PCB) may be reduced, the power part may be easily fixed without an assembly component such as a separate bolt, and heat generated by the power part may be easily dissipated.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure

What is claimed is:

1. A heat dissipation assembly structure of power parts, comprising:
    a housing having an open upper portion and a support protrusion protruding from a part of the housing, a first inclined surface formed on an upper portion of the support protrusion;
    a power part of the power parts, the power part having one surface supported by an insulating sheet disposed on the support protrusion, the one surface of the power part being in contact with and obliquely supported by the insulating sheet disposed on the first inclined surface of the support protrusion;
    a printed circuit board disposed above the power part and electrically connected to the power part;
    a cover member covering the open upper portion of the housing and coupled to the housing; and
    a heat dissipation pad in contact with the cover member and configured to press another surface of the power part in a direction toward the support protrusion to fixedly press the power part between the support protrusion and the heat dissipation pad.

2. The heat dissipation assembly structure of claim 1, wherein each of the housing and the cover member is formed of a metal material; and
    wherein the insulating sheet contacts the one surface of the power part, and the heat dissipation pad contacts the another surface of the power part, the housing and the cover member are configured to dissipate heat generated by the power part in two different directions.

3. The heat dissipation assembly structure of claim 1, further comprising:
    a pressing protrusion protruding from an inner surface of the cover member and pressing the heat dissipation pad in a direction toward the support protrusion,
    wherein the one surface of the power part is supported by the insulating sheet.

4. The heat dissipation assembly structure of claim 3, wherein a second inclined surface formed on the pressing protrusion is in contact with the heat dissipation pad, the heat dissipation pad being configured to press the another surface of the power part; and
    wherein the power part is fixedly pressed by the the heat dissipation pad in a direction of the first inclined surface.

5. The heat dissipation assembly structure of claim 3, wherein the heat dissipation pad is disposed between the pressing protrusion and the another surface of the power part.

6. The heat dissipation assembly structure of claim 5, wherein the heat dissipation pad has an elastic force; and
    wherein the heat dissipation pad is compressed by the pressing protrusion.

7. A heat dissipation assembly structure of power parts, comprising:

a housing having an open upper portion and a support protrusion protruding from a part of the housing, a first inclined surface formed on an upper portion of the support protrusion;

a power part of the power parts, the power part having one surface supported by an insulating sheet disposed on the support protrusion, the one surface of the power part being in contact with and obliquely supported by the insulating sheet disposed on the first inclined surface of the support protrusion;

a printed circuit board disposed above the power part and electrically connected to the power part;

a cover member covering the open upper portion of the housing and coupled to the housing; and a heat dissipation pad disposed between an inner surface of the cover member and another surface of the power part, a second inclined surface formed on one surface of the heat dissipation pad attached to the another surface of the power part to obliquely dispose the power part, wherein the heat dissipation pad in contact with the inner surface of the cover member is configured to press the another surface of the power part in a direction toward the support protrusion to fixedly press the power part between the support protrusion and the heat dissipation pad.

8. The heat dissipation assembly structure of claim 7, wherein the another surface of the power part is assembled in a state in which the another surface of the power part is attached to the one surface of the heat dissipation pad.

9. The heat dissipation assembly structure of claim 8, wherein the one surface of the power part is in contact with and obliquely supported by the insulating sheet disposed on the first inclined surface of the support protrusion;

wherein the one surface of the heat dissipation pad is in contact with the another surface of the power part; and wherein another surface of the heat dissipation pad is in contact with the inner surface of the cover member.

10. The heat dissipation assembly structure of claim 9, wherein, when the cover member is assembled to the housing, the inner surface of the cover member fixedly presses the power part obliquely coupled to the one surface of the heat dissipation pad in a direction toward the first inclined surface of the support protrusion.

11. The heat dissipation assembly structure of claim 9, wherein the heat dissipation pad has an elastic force and is compressed between the cover and the power part.

12. The heat dissipation assembly structure of claim 7, wherein each of the housing and the cover member is formed of a metal material; and wherein the insulating sheet contacts the one surface of the power part, and the heat dissipation pad contacts the another surface of the power part, and the housing and the cover member are configured to dissipate heat generated by the power part in two different directions.

* * * * *